(12) United States Patent
Weber et al.

(10) Patent No.: US 9,584,130 B1
(45) Date of Patent: Feb. 28, 2017

(54) PARTIAL RECONFIGURATION CONTROL INTERFACE FOR INTEGRATED CIRCUITS

(71) Applicant: Altera Corporation, San Jose, CA (US)

(72) Inventors: Scott J. Weber, Piedmont, CA (US); Sean R. Atsatt, Santa Cruz, CA (US); Yi Peng, Newark, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/164,503

(22) Filed: May 25, 2016

Related U.S. Application Data

(60) Provisional application No. 62/277,456, filed on Jan. 11, 2016.

(51) Int. Cl.
*H03K 19/173* (2006.01)
*H03K 19/177* (2006.01)
*H03K 19/003* (2006.01)
*G06F 17/50* (2006.01)

(52) U.S. Cl.
CPC ... *H03K 19/17756* (2013.01); *G06F 17/5054* (2013.01); *H03K 19/003* (2013.01); *H03K 19/17736* (2013.01)

(58) Field of Classification Search
CPC ....... H03K 19/17736; H03K 19/17756; H03K 19/003; G06F 17/5054
USPC .......................................................... 326/38
See application file for complete search history.

(56) References Cited

U.S. PATENT DOCUMENTS

| 7,864,620 B1 * | 1/2011 | Pedersen .............. G11C 7/1006 365/154 |
| 8,797,061 B2 * | 8/2014 | Margabandu .... H03K 19/17756 326/38 |
| 9,203,408 B1 * | 12/2015 | Peng .................... H03K 19/003 |
| 9,299,396 B1 * | 3/2016 | Lee .......................... G11C 5/14 |
| 2006/0178760 A1 * | 8/2006 | Mann ........................ G06F 8/38 700/27 |

\* cited by examiner

*Primary Examiner* — Don Le
(74) *Attorney, Agent, or Firm* — Fletcher Yoder, P.C.

(57) ABSTRACT

Systems and methods are provided for coordinating the partial reconfiguration of a region of a configurable device (e.g., a SDM/CNoC/LSM system or device) through an interface that coordinates the stopping of the current persona in that region, the resetting of the new current persona, and the starting of the new persona in a manner that does not corrupt the memory of the affected region. The interface further provides signaling that the static region can use to protect itself during the partial reconfiguration, and disallows multiple partial reconfigurations of the same region at the same time.

20 Claims, 8 Drawing Sheets

PARTIAL RECONFIGURATION CONTROL INTERFACE FOR INTEGRATED CIRCUITS

CROSS-REFERENCE TO RELATED APPLICATIONS

This application claims the benefit of and priority to U.S. Provisional Application No. 62/277,456, titled "Partial Reconfiguration Control Interface for Integrated Circuits" and filed Jan. 11, 2016, which is incorporated by reference herein in its entirety for all purposes.

BACKGROUND

The present disclosure relates generally to integrated circuits, such as field programmable gate arrays (FPGAs). More particularly, the present disclosure relates to providing a processor-based control interface for designing partial-reconfiguration (PR) regions and associated PR personas, such that recompilation of personas and/or static logic may be reduced.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits are used in numerous electronic devices and for numerous purposes. Some integrated circuits include programmable logic, such as field programmable gate array (FPGA) fabric, that can be programmed to support a variety of circuit designs after manufacturing. These programmable logic devices may contain programmable logic circuitry that can be programmed to perform a variety of functions.

Some programmable logic devices support a form of programming referred to as "partial reconfiguration." Partial reconfiguration involves programming an initial programmable logic design into the programmable logic device that can be rapidly reconfigured during runtime. Thus, while the initial programmable logic design may take a substantial amount of programming time (e.g., on the order of hours), partial reconfiguration during runtime may be faster (e.g., on the order of seconds). The initial programmable logic design may include a number of logic elements that can be rapidly reprogrammed during runtime. This allows the initial programmable logic design to support many different partial reconfiguration implementations, known as "personas," to be rapidly reprogrammed during runtime.

Thus, partial reconfiguration allows a programmable logic device to switch personas faster than the time it would take to fully reprogram the programmable logic device with a new initial programmable logic design. Despite this, even the short time involved in switching personas may present undesirable latency for some use cases. The impact of this latency may be compounded for use cases that involve switching personas relatively often.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Systems, methods, and devices of this disclosure may avoid some latency associated with partial reconfiguration by creating a partial-reconfiguration (PR) control interface in a programmable processor, where designers may design PR regions and associated PR personas to the PR control interface. In many instances, such usage of PR control interfaces may reduce recompilation of personas and/or static logic. For example, designers may create a set of register-transfer level (RTL) designs that implement a common control interface, which communicates with the configuration sub-system and a PR host, to coordinate the context swapping of the RTL designs in a well-defined manner. Portions of the interface may be implemented in programmable processors that interface the PR regions and are controlled by a combination of software running on the processors and a PR bit stream.

In effect, this results in a standard interface for designing PR regions/PR personas, which allows for a well-defined mechanism to build PR systems. Further, it may reduce complexity in modifying and/or adding new personas to the PR systems. Indeed, by implementing some of the interface outside the fabric in programmable processors, the interface may be modified and/or customized through software changes and bitstream changes instead of requiring a time-costly recompile.

Various refinements of the features noted above may be employed in relation to various aspects of the present disclosure. Further features may also be incorporated in these various aspects as well. These refinements and additional features may be employed individually or in any combination. For instance, various features discussed below in relation to one or more of the illustrated embodiments may be incorporated into any of the above-described aspects of the present invention alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in further detail below, embodiments of the present disclosure relate generally to circuitry and/or machine-readable instructions stored on a tangible, non-transitory, machine-readable medium for enabling apps to be implemented on an integrated circuit (IC). In particular, a partial reconfiguration control interface may work in conjunction with partial reconfiguration functionality of an IC to increase efficiencies of partial-reconfiguration on the IC.

Figure 1:
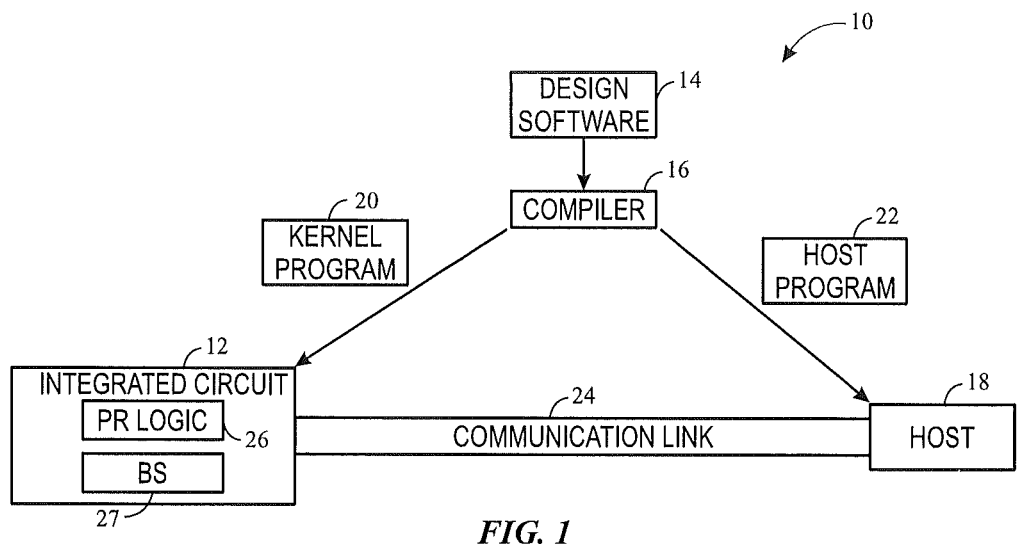
FIG. 1 is a block diagram of a system that utilizes partial-reconfiguration logic, in accordance with an embodiment.

With the foregoing in mind, FIG. 1 illustrates a block diagram of a system 10 that utilizes adaptable logic to affect a machine-implemented program. As discussed above, a designer may desire to implement functionality on an integrated circuit 12 (IC, such as a field programmable gate array (FPGA)). The designer may specify a high level program to be implemented, such as an OpenCL program, which may enable the designer to more efficiently and easily provide programming instructions to implement a set of programmable logic for the IC 12 without requiring specific knowledge of low level computer programming languages (e.g., Verilog or VHDL). For example, because OpenCL is quite similar to other high level programming languages, such as C++, designers of programmable logic familiar with such programming languages may have a reduced learning curve than designers that are required to learn unfamiliar low level programming languages to implement new functionalities in the IC.

The designers may implement their high level designs using design software 14, such as a version of Quartus by Altera™. The design software 14 may use a compiler 16 to convert the high level program into a low level program. The compiler 16 may provide machine-readable instructions representative of the high level program to a host 18 and the IC 12. For example, the IC 12 may receive one or more kernel programs 20 which describe the hardware implementations that should be stored in the IC. The host 18 may receive a host program 22 which may be implemented by the kernel programs 20. To implement the host program 22, the host 18 may communicate instructions from the host program 22 to the IC 12 via a communications link 24, which may be, for example, direct memory access (DMA) communications or peripheral component interconnect express (PCIe) communications. Partial-reconfiguration logic 26 may be stored on the IC 12 and controlled by the host 18. As will be described in more detail below, the host 18 (or other device) may provide one or more PR bitstreams 27 for use in conjunction with the PR logic 26, such that certain functionalities described by the PR bitstreams 27 may be executed on the IC 12. For example, the PR bitstreams 27 may cause CRAM bits of the PR logic 26 to be reconfigured, causing operations/functionalities of the IC 12 to modify.

Figure 2:
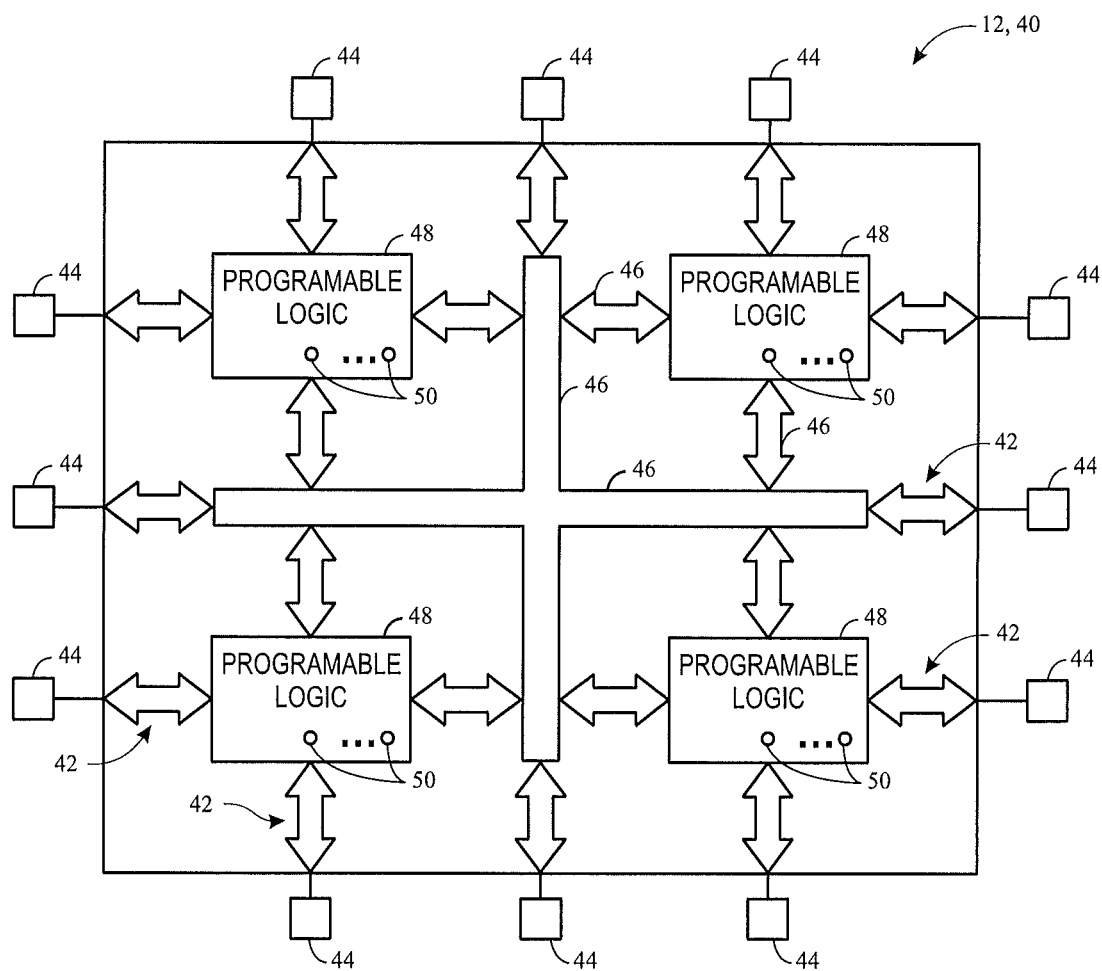
FIG. 2 is a block diagram of a programmable logic device that may include partial-reconfiguration logic, in accordance with an embodiment.

Turning now to a more detailed discussion of the IC 12, FIG. 2 illustrates an IC 12, which may be a programmable logic device, such as a field programmable gate array (FPGA) 40. For the purposes of this example, the device 40 is referred to as an FPGA, though it should be understood that the device may be any type of programmable logic device. As shown, FPGA 40 may have input/output circuitry 42 for driving signals off of device 40 and for receiving signals from other devices via input/output pins 44. Interconnection resources 46, such as global and local vertical and horizontal conductive lines and buses, may be used to route signals on device 40. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48. As discussed in further detail below, the FPGA 40 may include adaptable logic that enables partial reconfiguration of the FPGA 40, such that kernels may be added, removed, and/or swapped during the runtime of the FPGA 40.

Programmable logic devices (PLDs), such as FPGA 40, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

As discussed above, the FPGA 40 may allow a designer to create a customized design capable of executing and performing customized functionalities. Each design may have its own hardware implementation to be implemented on the FPGA 40. For instance, a single hardware implementation may be utilized for each kernel in a design for the FPGA 40.

Figure 3:
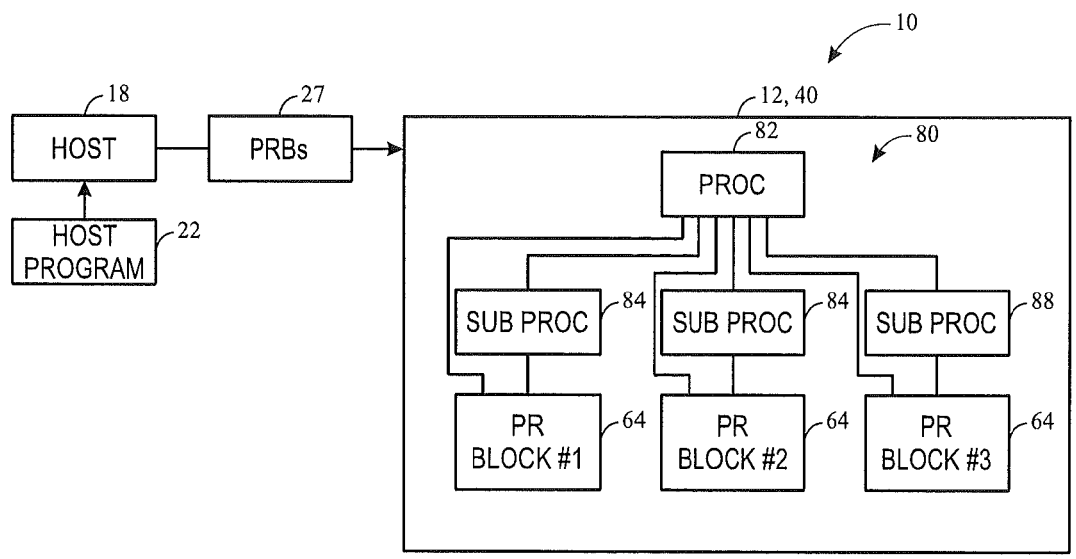
FIG. 3 is a block diagram illustrating elements of the host and integrated circuit of FIG. 1, in accordance with an embodiment.

Referring now to FIG. 3, a block diagram illustrating the system 10, further detailing elements of the host 18 and IC 12 of FIG. 1 is provided. As illustrated, some ICs 12, such as a Stratix® V FPGA by Altera®, provide partial reconfiguration capabilities. For example, in some embodiments, the configurable components may include a number (N) of partial reconfiguration (PR) blocks 64 stored on an IC 12 (such as FPGA 40 of FIG. 2). The PR blocks 64 may provide an ability to reconfigure part of the IC 12 while the rest of the device continues to work.

Communications between the host 18 (or another processor) and the IC 12 may be very useful in enabling partial-reconfiguration functions on the IC 12. For example, the host 18 may provide one or more bitstreams 27 for implementation on the IC 12. The PR blocks (or regions) are regions of the IC that are dynamically controlled by a set of CRAM frames (e.g., bits stored in configuration RAM (CRAM)). The CRAM frames may be altered without impacting the functionality of other programming of the IC 12. In contrast to non-partial reconfiguration design, which reprograms an entire CRAM array when changes are made to the design, the partial reconfiguration design may dynamically reprogram one or more CRAM frames. During partial reconfiguration, a PR host may provide replacement logic in one or more PR blocks/regions 64. The PR host sends a freeze signal to the PR blocks/regions 64 and accommodates handshaking with the PR control block so that clock, data, and other signals are implemented properly in the CRAM.

To implement the bitstreams 27, the bitstreams 27 may be transferred to the IC 12 (e.g., via the host 18) where they are implemented in the PR blocks/regions 64. For example, a software driver on a device (e.g., the host 18) may send the PR bitstreams 27 to the PR host (e.g., via a PCIe interface). The PR host may communicate with the PCIe interface 80 through a pre-existing interface of the IC 12 (e.g., the Avalon® Memory Mapped Interface (Avalon-MM), which is an address-based read/write interface).

In the current embodiment, a partial-reconfiguration interface 80 may be composed of a processor 82 and/or sub-processors 84, 86, and/or 88 that are associated with the PR blocks 64. As described in more detail below, the interface 80 may provide an ability to swap partial-reconfiguration personas in the PR blocks 64, with minimize re-compilation of static resources.

As used herein, the terms "execute" or "implement" when used in relation to a PR bitstreams 27, may refer to modifying specific CRAM bits during normal device operation based upon instructions defined in a PR bitstream 27. Modifying these CRAM bits may result in behavioral changes to particular core resources (e.g., logic array blocks (LABs), M20K memory blocks, memory logical array blocks (MLABs), memory blocks, digital signal processors (DSPs), core routings, spine clocks, row clocks, etc.), and/or memory-mapped interfaces, such as dynamic partially reconfigurable I/O (DPRIO) interfaces. Once loaded, these bitstreams 27, may reconfigure the high speed serial interface (HSSI) and/or the external memory interface (EMIF) channels using general purpose I/O (GPIO) and/or dynamic partially reconfigurable I/O interfaces (DPRIO) Memory Mapped interfaces (e.g., to adjust data rates and/or cause recalibration).

As mentioned above, a partial reconfiguration (PR) control interface may be implemented on a software-controlled configuration architecture composed of a centralized processor which communicates with an array of sub-processors. The PR control interface may include processors using a network-on-chip. Designers may create their PR designs to use this control interface to design their PR system, which may create new efficiencies in PR functionality implementation.

The process of designing a PR system may involve defining: the static region, PR host, PR regions, and PR personas. The static region is the logic that does not change in the system. The PR host, which can be internal to the FPGA or external, is the controller that interacts with the configuration sub-system to initiate and perform PR operations and is part of the static region. A PR region is a portion of the FPGA with a fixed I/O interface and set of resources. Multiple PR regions may be implemented, although in some instances each PR region may utilize exclusive access to its resources. A persona is a configuration of the resources of a PR region that uses a subset of the PR region's I/O interface. In some embodiments, there may be no limit to the number of personas that can be implemented in a PR region, but only one can be resident in the PR region at any time. Furthermore, a persona belongs to a single PR region.

Figure 4:
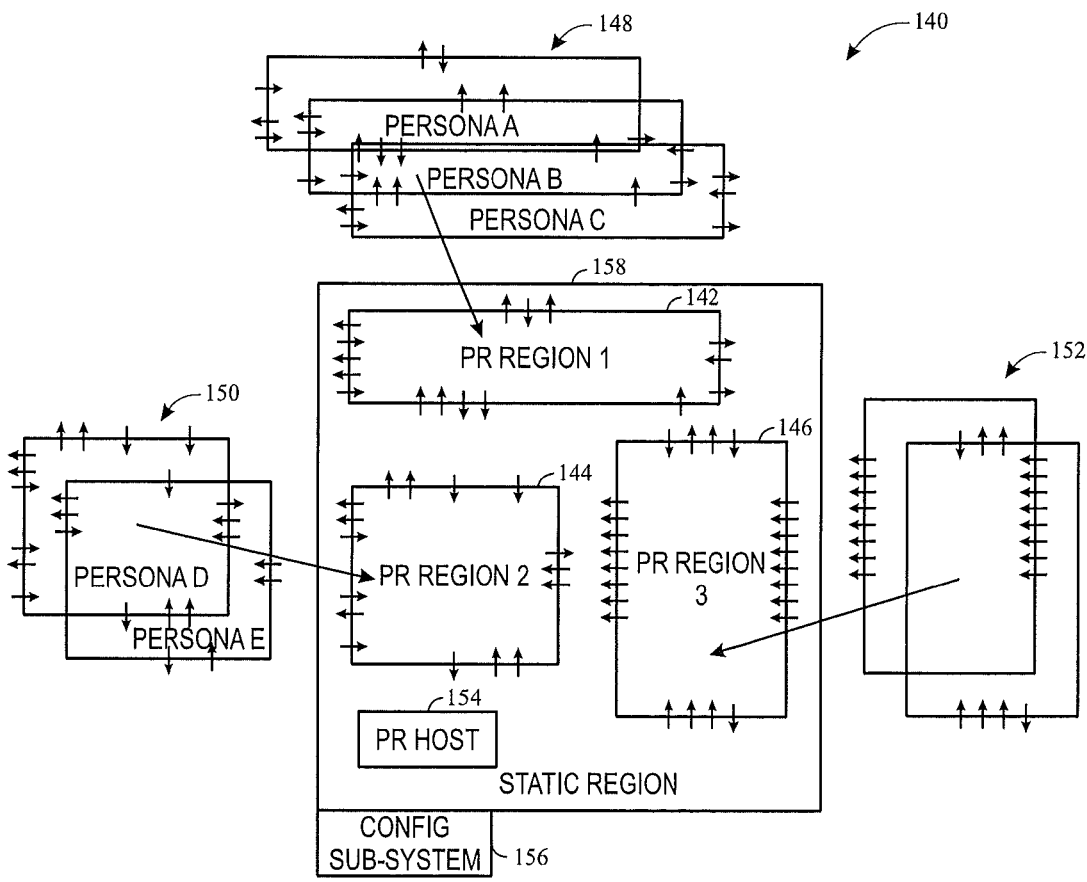
FIG. 4 is a schematic diagram illustrating organization of PR system, in accordance with an embodiment.

The organization of a PR system 140 is shown in FIG. 4. As illustrated in FIG. 4, there are three PR regions 142, 144, and 146 shown with a collection of personas 148, 150, and 152 associated with the PR regions 142, 144, and 146, respectively. Each persona uses a subset of the Input/Outputs (I/Os) defined by the associated PR region and only uses the resources of the PR region. An internal PR host 154 is shown that has connections to the configuration sub-system 156. If the PR host 154 were external (e.g., as in FIG. 3), it would communicate with the FPGA through I/Os. The PR host 154 coordinates receiving a PR bitstream (e.g., bitstream 27 of FIG. 1) and sending it to the configuration sub-system 156. The configuration sub-system 156 executes the PR bitstream 27 to reconfigure a PR region (e.g. 142, 144, and/or 146) with a new persona (e.g., one of 148, one of 150, and/or one of 152). The PR host 154 also has to make sure that the system 140 continues to function correctly before, during, and after reconfiguring a PR region with a new persona.

The PR system-level coordination between the PR host 154, PR regions 142, 144, and 146, and static region 158 controls a PR operation. A PR host 154 initiates a PR operation and the existing persona in the targeted PR region is replaced by the new persona. Coordination between the PR host 154 and the existing persona is customized by the designer. The customization is spread across the PR host 154, PR regions 142, 144, and 146, personas 148, 150, and 152, and interfacing static region 158.

A PR control interface may simplify the coordination, such that PR functionality may be more accessible and widely used. The PR control interface may, in some embodiments, be implemented on a distributed software-controlled configuration network that utilizes a minimal amount of fabric resources.

Software-controlled coordination between the PR components may result in: clean stopping of the executing persona that is being swapped out (e.g., stopping execution of Persona A, when it will be swapped with Persona B for PR region 1 142), protecting the static region 158 during the PR operation, protecting memories in the PR region (e.g., 142) during a PR operation, and cleanly starting the new persona (e.g., Persona B of Personas 148).

Little flexibility in this coordination is lost by implementing the steps of stopping an existing persona, resetting the new persona, and starting the new persona using a common PR control interface. Moreover, by making the components of the interface optional and accessible to both the PR region (e.g., 142) and static region 158, PR system 140 level designers are afforded the ability to customize the use of the PR control interface.

The common PR control interface also addresses the potentially complex issue of modifying and or adding personas into an existing PR system 140. The modified or new personas may be restricted to use the I/Os and resources of the PR region (e.g., 142, 144, and/or 146) to which they belong. However, there may be no restriction on what the function of the persona is and/or how the personas use the I/Os. Accordingly, if the modified or new persona necessitates stopping, resetting, and/or starting, changes to the PR host 154 may be necessary. However, if the personas and PR host 154 implement a common PR control interface that handles these operations, then it is possible to integrate these modified and/or new personas without requiring changes to the PR system 140.

The discussion now turns to a more detailed description of the PR control interface. The PR control interface provides an interface between a) the software-controlled configuration sub-system (e.g., at least a portion of the configuration subsystem 156) and the PR regions (142, 144, and 146) and/or static region 158 and b) the interface between the PR host 154 and the software-controlled configuration sub-system (e.g., at least a portion of the configuration subsystem 156). The software-controlled configuration sub-system is defined as a network of hardened programmable processors that communicate on a network-on-chip to a centralized control processor. As used herein, "configuration sub-system" refers to this software-controlled configuration sub-system. The configuration sub-system 156 consumes a minimal amount of fabric routing resources to handle the signaling between the fabric used by the PR personas 148, 150, and 152 and the configuration sub-system 156. The interface between the configuration sub-system 156 and a PR region 142, 144, and/or 146 is defined at the I/O boundary of a PR region as follows:

Stop_REQ—An assertion of this configuration sub-system 156 output requests that the existing persona stop executing.

Stop_ACK—An assertion of this configuration sub-system 156 input acknowledges that the executing has stopped and a new persona can be swapped in.

Freeze—This configuration sub-system 156 output is asserted to let the static logic interfacing the PR region know that a PR operation is happening and that that the static region should protect itself appropriately.

Reset—This configuration sub-system 156 output is toggled by the non-fabric configuration sub-system after the PR operation completes in order to apply the "soft reset" of the new persona.

Start_REQ—An assertion of this configuration sub-system 156 output by the non-fabric configuration sub-system requests the new persona to start executing.

Start_ACK—An assertion of this configuration sub-system 156 input acknowledges that the new persona has started executing and that the PR region is prepared to handle another Stop_REQ.

The details of an interface between the PR host 154 and the configuration sub-system 156 will be discussed in more detail below. To understand the interface between the configuration sub-system 156 and the PR regions 142, 144, and 146, the concept of a PR_Request will be outlined first. A PR_Request is a signal that is provided from the PR host 154 to the configuration sub-system 156 to initiate a PR operation for a specified PR region. Such a request will start the sequencing of the interface between the configuration sub-system 156 and the specified PR region.

Figure 5:
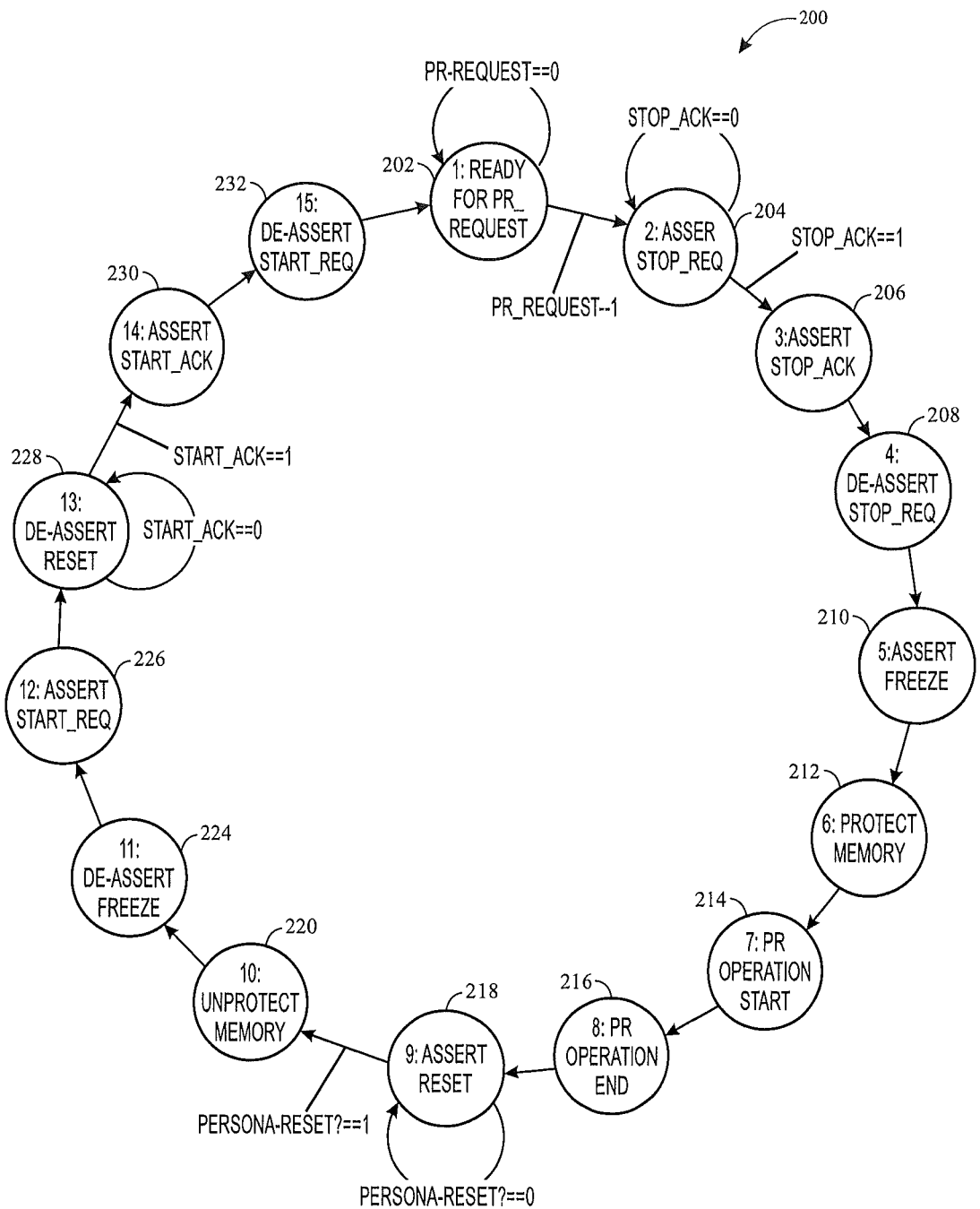
FIG. 5 is a schematic diagram illustrating a finite state machine that details a sequencing of signals during a PR operation, in accordance with an embodiment.

FIG. 5 illustrates a finite state machine (FSM) 200 detailing the sequencing of these signals during a PR operation, in accordance with an embodiment. This state machine 200 exists for each PR region (e.g., 142, 144, and 146). The system begins in state 1 202, waiting for a PR_Request. After the PR_Request, the configuration sub-system 156 asserts Stop_REQ in state 2 204. After the responding Stop_ACK is asserted in state 3 206, the configuration sub-system 156 de-asserts Stop_REQ in state 4 208. After state 4, Freeze is asserted in state 5 210 to signal to the static region 158 that a PR operation is about to begin. In state 6 212, the configuration sub-system 156 protects the memories in the PR region 142, 144, and/or 146 from having their contents corrupted by the PR operation that begins in state 7 214 and ends in state 8 216. After the PR operation has completed the partial reconfiguration of the new persona, the configuration sub-system 156 asserts Reset in state 9 218 to initiate the "soft reset". After the Reset has been asserted long enough to bring the new persona into its reset state, the configuration sub-system 156 removes the protection on the memories in state 10 220 so that the new persona can access and modify the memories in the PR region. Freeze is de-asserted next in state 11 224 so that the new persona and interfacing static region can begin to communicate. In state 12 226, the configuration sub-system 156 signals that the new persona should start by asserting Start_REQ. The Reset is de-asserted in state 13 228, and the new persona is able to respond to the Start_REQ and can communicate with the interfacing static region 158. After the Start_ACK assertion in state 14 230, the configuration sub-system de-asserts Start_REQ in state 15 232 and then moves back to state 1 202 and the FSM 200 begins waiting for the next PR_Request. To avoid conflicts, in certain embodiments, any PR_Request that came in during states 2-15 (204-232) may not be accepted.

This interface embodiment provides minimal handshaking to allow personas to control a clean stopping and starting within a PR system 140 that continues executing other PR regions 142, 144, and/or 146 and static logic (e.g., in the static region 158). The first step of bringing down the existing persona is to stop it cleanly. By providing the Stop_REQ/Stop_ACK handshake (e.g., states 1-3 202-206), the executing persona has the ability to cleanly stop. Some examples of stopping behavior may be to finish handling a well-defined data packet, finish a safety critical action, and save state to a static region to enable context swapping and/or check-pointing.

The Freeze signaling provides a way for the static logic to protect itself against unknown values coming from the PR region 142, 144, and/or 146 being reconfigured and also to communicate to the static logic that inputs sent to the PR region 142, 144, and/or 146 being reconfigured will not be handled. An example use model of how the Freeze signal is used is to signal an output interface shim on the PR region under reconfiguration to produce known constant values to the interfacing logic. The time between Stop_ACK being asserted (e.g., state 3 206), Freeze being asserted (e.g., state 5 210), and the PR operation starting (e.g., state 7 214) will be long enough such that the Freeze signal can be received across the device. However, if the interfacing logic should desire more time to react to Freeze, then it could coordinate with the executing personas of the PR region in the Stop_REQ/Stop_ACK handshake (e.g., states 1-3 202-206).

After the existing persona has stopped and the static region has been informed of the pending PR operation through the assertion of Freeze (e.g., state 5 210), the configuration sub-system protects the memories of the PR region (e.g. state 6 212) from being corrupted during a PR operation. This protection may allow memory contents to be preserved during a PR operation, which may be useful in some use cases. Further, in order to protect initialized memories in the new persona, a careful coordination of resetting the new persona and avoiding the corruption of the initialized memories may be desirable.

After the PR operation has completed (e.g., state 8 216) and before the memory protection is removed (e.g., state 10 220), the Reset signal is asserted (e.g., state 9 218) by the configuration sub-system to initiate a "soft reset" of the new persona. The purpose of the Reset is to bring the persona into a known reset state. The duration of the Reset toggle may be defined by a sufficient amount of time to bring the persona into the known reset state. Defining this duration can be done through a combination of analysis, designer input, and conservativism and will be discussed below. Many PR use scenarios do not support initial conditions and, thus, the persona be placed into a known state before initiating a Start_REQ (e.g., state 12 226)/Start_ACK (e.g., state 14 230). Although personas are not restricted to using resets other than the Reset of the configuration sub-system band resets, doing so means that the sequencing of Reset, memory protection, and Start_REQ/Start_ACK may be lost.

The memory protection is still enabled during the initiation of the Reset assertion (e.g., state 9 218). By retaining memory protection during the Reset assertion, the clocks to the new persona may be continue to run, despite a "dawn of time" scenario where there is a period between when the PR operation ends (216) and when the Reset has been held long enough to put the persona into its reset state (e.g., as illustrated by PERSONA-=RESET?==1). Without memory protection, corruption could occur on the memories in the new persona. After this "dawn of time" scenario has completed, the memory protection can be disabled (e.g., state 10 220).

Next, the configuration sub-system prepares to do the Start_REQ/Start_ACK handshake (e.g., states 12-15 226-232). To do this, the configuration sub-system 156 first de-asserts Freeze (e.g., state 11, 224) which signals to the interfacing static logic, that the new persona is up and running and will shortly be released from its Reset. While Reset is still asserted and after Freeze is de-asserted, the Start_REQ is asserted (e.g., state 12 226) by the configuration sub-system. Next, the Reset is de-asserted (state 13 228) and the new persona is now running and interacting with its interfacing static logic. After the new persona has completed its necessary starting sequence, Start_ACK is asserted (e.g., state 14 230). After the Start_REQ/Start_ACK handshake (e.g., states 12-15 226-232) completes, the PR region 142, 144 and/or 146 is in a state to receive a new PR_Request (e.g., state 1 202). By providing the Start_REQ/Start_ACK handshake (e.g., states 12-15 226-232), the new persona has the ability to cleanly start.

In one embodiment, the starting behavior may include running an initialization sequence that is not a simple reset and swap in state from a static region that was stored by a previously executing persona. The time between Freeze being de-asserted (e.g., state 11 224), Start_REQ being asserted (e.g., state 12 226), and Reset being de-asserted (e.g., state 13 228) may be long enough such that these signals can be received across the device, but if the interfacing logic should desire more time to react, then it could coordinate with the executing personas of the PR region in the Start_REQ/Start_ACK handshake (e.g., states 12-15 226-232).

Figure 6:
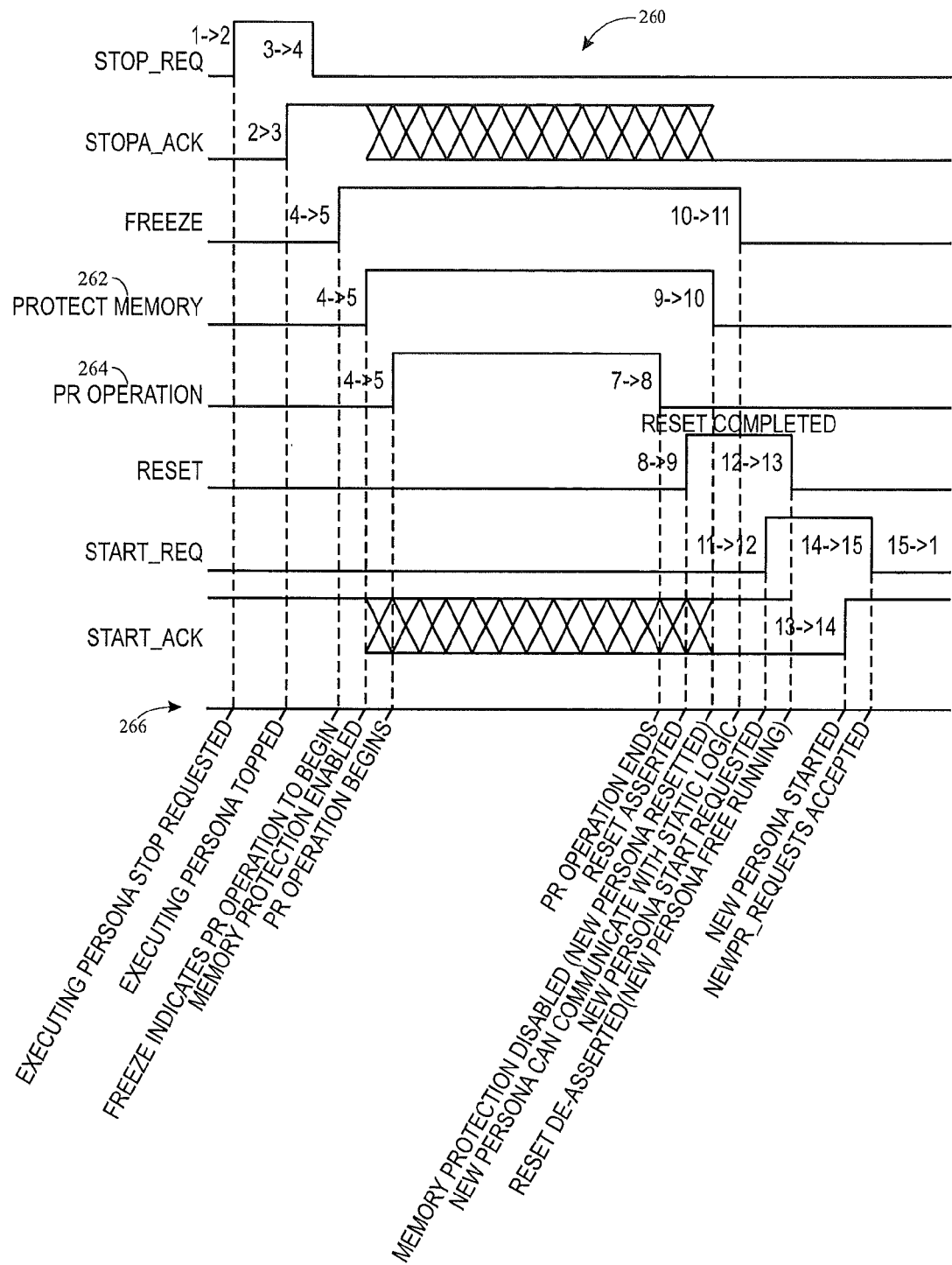
FIG. 6 illustrates a waveform of signals involved in the sequencing of FIG. 5, in accordance with an embodiment.

The waveform 260 for the signals involved in the PR control interface is shown in FIG. 6, in accordance with certain embodiments. The points where transitions between the states occur in FIG. 5 are shown on the waveforms 260. The "Protect Memory" and "PR Operation" waveforms 262 and 264 indicate when the activity is happening and are not actual signals. The timeline 266 at the bottom of FIG. 6 describes the timeline of events.

With this REQ/ACK handshaking interface, there is always the possibility that the ACK does not return. This could be caused by a number of reasons including a malfunctioning persona or static logic, a problem with the persona's interaction with the system 140 outside its PR region 142, 144 and/or 146, or an abusive persona that simply refuses to ACK. In some embodiment, in order to keep the system functioning, a timeout orchestrated by the configuration sub-system to override the lack of an ACK may be useful. Additionally and/or alternatively, more sophisticated protocols can be implemented as part of the system's operating system.

To implement the PR control interface, the PR system designer connects the interface signals between the configuration sub-system 156 and their PR regions 142, 144, and/or 146. Each PR region has a unique PR control interface with the configuration sub-system since changing the persona of one PR region is completely independent of changing the persona of another. Multiple persona changes may occur simultaneously, assuming the configuration sub-system 156 has the capabilities to support such an operation. At any time, the configuration sub-system 156 may issue a PR request to switch personas in a PR region using the PR control interface. Connections between the PR control interfaces (PR_CTRL_IF) (e.g., 304A,B, and/or C) and the PR regions are shown in the schematic diagram 300 of FIG. 7. The signals 302 between the PR_CTRL_IFs 304A-C and the PR regions 142, 144, and 146 are done in fabric resources. The implementation of the PR control interface FSM 200 is done on a subset of the array of software-controlled processors of the configuration sub-system 156.

Figure 7:
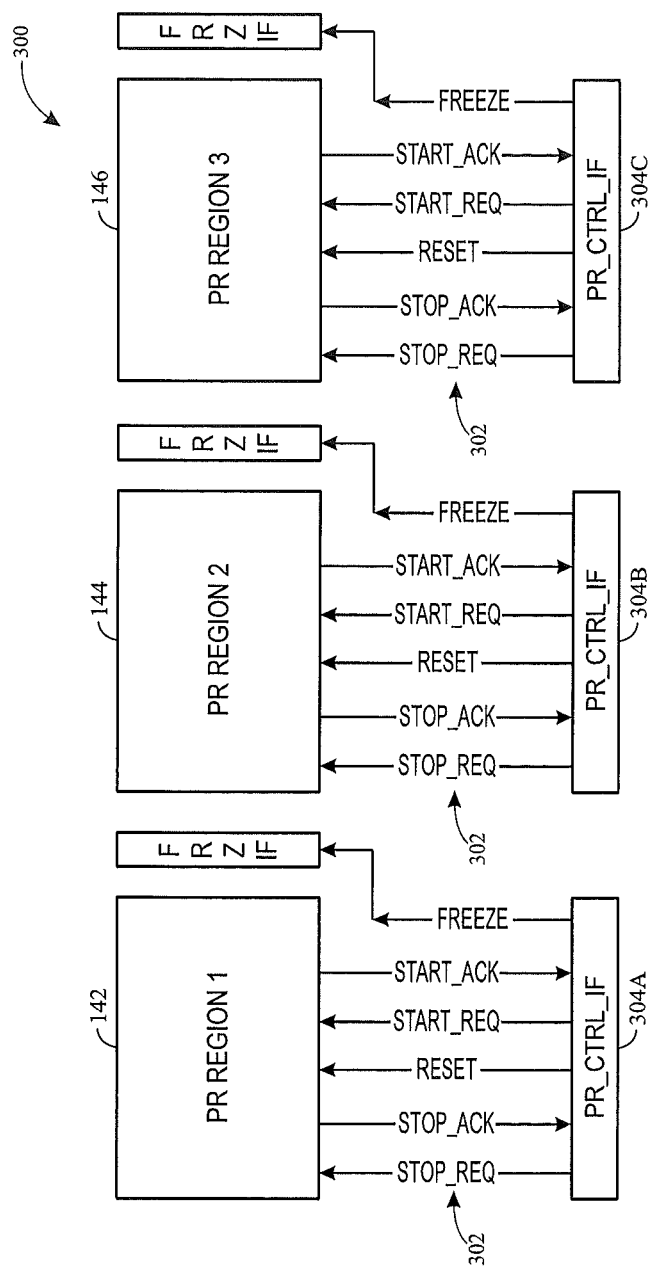
FIG. 7 is a schematic diagram illustrating the connections between the PR control interface and the PR regions, in accordance with an embodiment.

In FIG. 7, the Freeze signal is shown connected a FRZ IF (i.e. freeze interface). The static region 158 interfacing the PR regions 142, 144, and/or 146 use the appropriate Freeze to protect the static region 158. Further, the personas 148, 150, and 152 may be tasked with implementation of a portion of the PR control interface handshake.

A PR_CTRL_IF (e.g., 304A-C) is associated with a specific PR region (e.g., 142, 144, and/or 146). However, the signals of the PR_CTRL_IF that the PR region chooses to consume and provide may vary. This allows for backwards compatibility with existing PR systems that do not use the PR control interface and allows customization on new PR systems if desired. The PR_CTRL_IF 304A, B, and/or C may implement the signaling of the FSM shown in FIG. 7, regardless of the connectivity, as a well-defined set of default values on the undriven inputs to the PR_CTRL_IF exists. In some embodiments, when the Stop_ACK and/or Start_ACK are not driven, they will have the default driver of a constant 1. In the case of the Stop_REQ/Stop_ACK handshake, these defaults may result in the existing persona immediately stopping when requested. In the case of the Start_REQ/Start_ACK handshake, these defaults may result in the new persona being able to be swapped out immediately after the PR operation completes. An attribute that associates a PR_CTRL_IF with a PR region may be used, when there are no connections.

Figure 8:
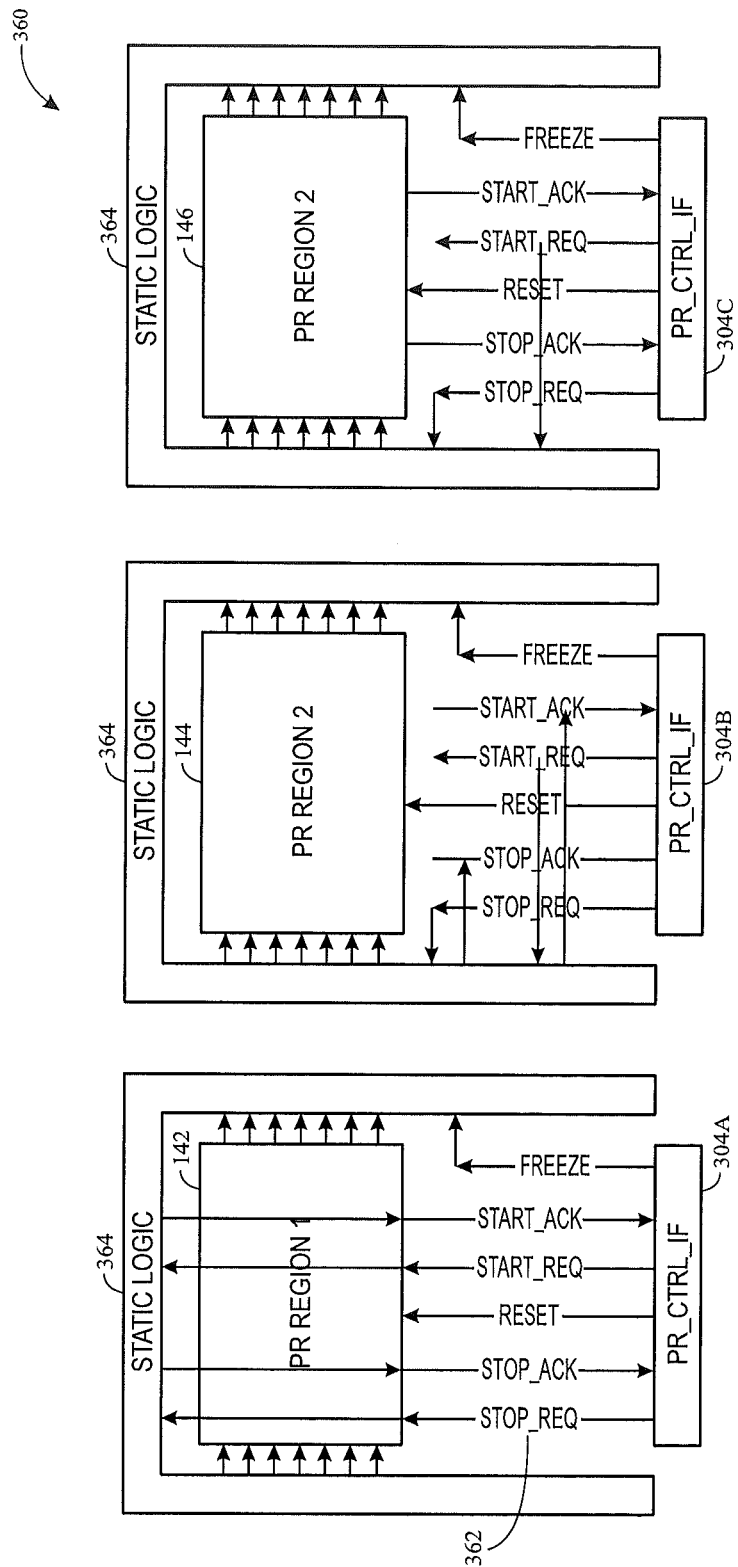
FIG. 8 is a schematic diagram illustration connection alternatives, in accordance with an embodiment.

In FIG. 7, all of the signals of the PR_CTRL_IFs 304A, B, and/or C are connected to their associated PR region 142, 144, and/or 146. However, in alternative embodiments, this may not be the case. There is no requirement to connect all the signals of PR_CTRL_IFs 304A-C. Further, there is also no restriction as to where the signals connect. Some connectivity alternatives 360 are provided in FIG. 8.

PR Region 1 142 is shown to forward the PR_CTRL_IF 304A signals 362 and delegate their consumption and production to the static logic 364. The organization of PR Region 1 142 would appear identical to those shown in FIG. 7, except more signals may be utilized for the PR region.

PR Region 2 144 is shown to send all but the Reset signal 366 to the static logic 364. This provides the same delegation that was shown for PR Region 1 144, but does not require the forwarding connections through the PR Region.

PR Region 3 146 shows a mix of signals going to the PR region 146 and the static region 364. In this configuration, the static region 364 accepts the stop and start requests and negotiates with the persona on when to acknowledge the requests. Other organizations are possible. Each variable organization may provide a particular PR control interface protocol via the PR_CTRL_Ifs 304A-C.

The assertion and de-assertion of Stop_REQ, Stop_ACK, Freeze, Start_REQ, and Start_ACK have transactional semantics and are under the control of the configuration sub-system and personas. These signals are asynchronous and can be considered false paths for timing. Since in many scenarios, the personas do not support initial conditions, a proper "soft reset" may be provided to bring the persona into a reset state. The length that the Reset may be asserted may be long enough to get into the reset state. The time between the assertion of the Reset and when the persona is a stable reset state will be called the "dawn of time". The Reset may be held at least the amount of maximum time that any state has been retimed backwards so that the state is back into the time frame of the original un-retimed circuit. Further, the Reset may be held long enough such that the signal is propagated to all the state elements that utilize it (e.g. a long pipeline could delay the Reset). Additionally, the Reset may be held long enough such that any downstream state that should be flushed by the Reset of an upstream state is flushed properly. The length of the "dawn of time" may be calculated by analyzing the clocking, retiming, pipelining, and reset circuitry. The length should be large enough to do a proper "user reset". It should be noted that the user has to calculate the length of the "dawn of time" regardless if they use the PR control interface or not in order to get their persona to work correctly. The only difference here is that if the Reset is provided by the PR control interface, the length of the Reset toggle has to be communicated in a manner other than RTL. With the PR control interface, the length can be communicated by the compiler to the configuration sub-system and/or by a designer input.

Figure 9:
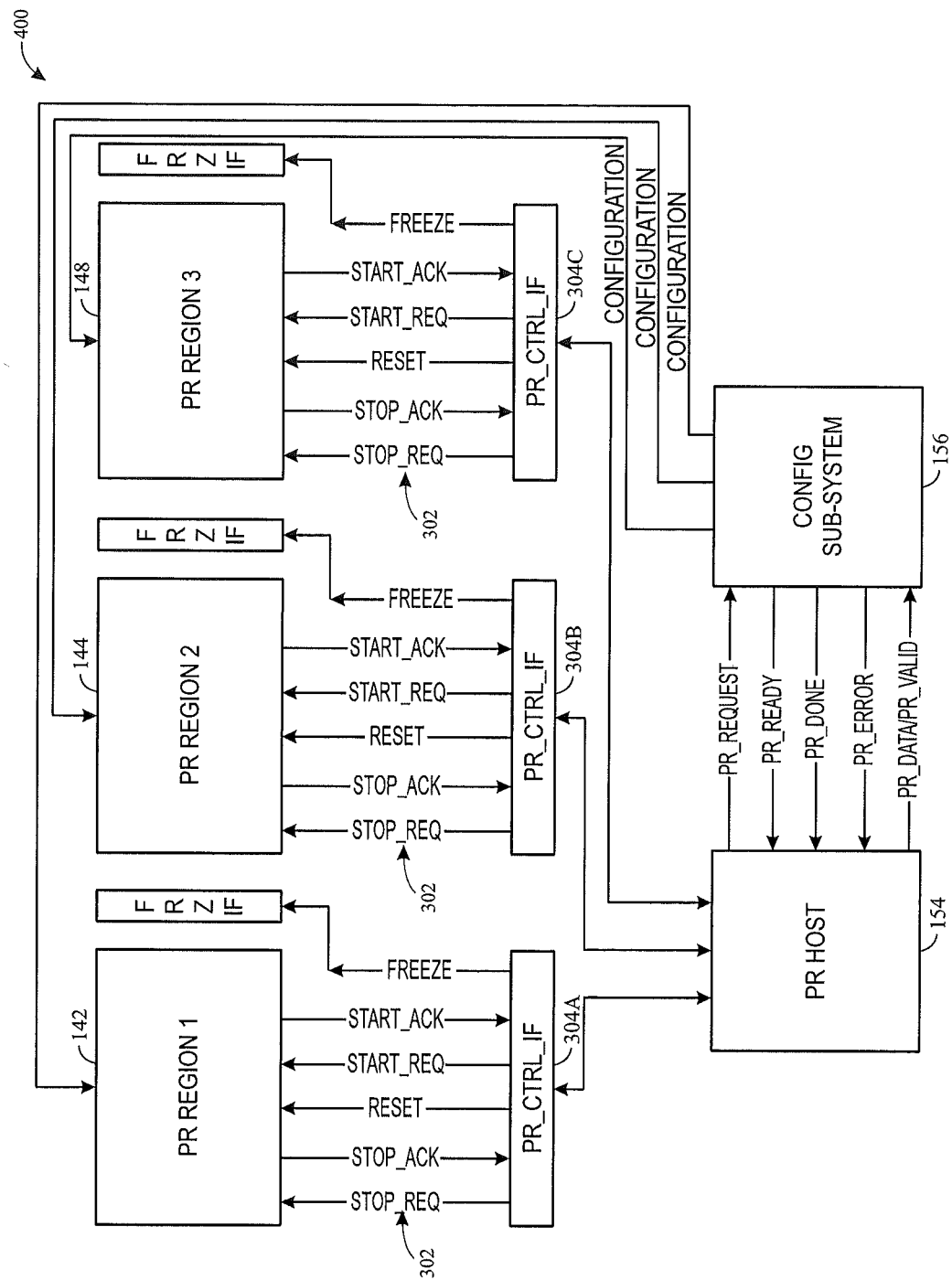
FIG. 9 is a schematic diagram illustrating a PR control system, in accordance with an embodiment.

As discussed, the PR control interface is split between a) the interface between the configuration sub-system 156 and the PR regions 142, 144, and/or 146 and b) the interface between the PR host 154 and the configuration sub-system 156. A PR operation may be invoked using the PR control interface, by the PR host 154 making a PR_Request to the configuration sub-system. If the PR control interface FSM (e.g., 200) accepts the request, then the PR host 154 provides the PR bitstream 27 to the configuration sub-system. This PR bitstream 27 contains the information useful for the PR control interface to execute. The full PR control system 400 using the organization of the PR_CTRL_IF and PR regions 142, 144, and/or 146 of FIG. 7 is shown in FIG. 9. The interface between the PR host 154 and configuration sub-system 156 works as follows. The PR host 145 makes a PR_Request to the configuration sub-system 156 asking to perform a PR operation on a particular PR Region 144, 146, and/or 148. If the PR control interface 304A, B, and/or C of that PR region 144, 146, and/or 148 accepts the request, and the configuration sub-system 156 is ready for a PR operation then it will assert PR_Ready. The PR host 154 then provides the PR bitstream 27 using the PR_Data/PR_Valid signals. The PR bitstream 27 is used in concert with the PR control interface FSM (e.g., 200) to cycle through the FSM. The configuration sub-system 156 may govern the flow of the PR bitstream 27 as the FSM dictates through the PR_Ready signaling. After the entire PR bitstream 27 has been sent, the PR host 154 waits for a PR_Done to be asserted from the configuration sub-system 156 to indicate success. If there is an error at any point, the configuration sub-system 156 asserts a PR_Error.

The portion of the configuration sub-system 156 that handles the execution of the PR bitstream 27 may be hardened and not accessible to the designer out of concerns of security, safety, and usability. The bitstream 27 is an instruction stream that has to be provided to the system 400. However, the system operations after that may be abstracted away from the designer. The PR host 154-to-configuration sub-system 156 connections provide the interface to deliver that PR bitstream 27 to the system 400. In some embodiments, the PR host 154 may be implemented on the fabric as an internal host or as an external host. Further, the PR_CTRL_Ifs 304A-C may be implemented in soft logic or as a mix of hard and soft logic.

If the PR_CTRL_IFs 304A-C are implemented as soft logic, as is shown in FIG. 9, then the PR host 154 will coordinate the control of the PR_CTRL_Ifs 304A-C. Implementing the PR control interfaces 304A-C in this manner can work when the interface is not implemented in the configuration sub-system 156. Each PR_CTRL_IF 304A, B, and C uses fabric resources to build its FSM and the control of the PR_CTRL_IFs 304A-C is centralized and coordinated at the PR host 154. Fabric resources are also utilized to build the communication between the individual PR_CTRL_Ifs 304A-C and the PR host 154. Although this embodiment is feasible, it may add complexity to the user's PR host 154 and consume fabric resources.

Figure 10:
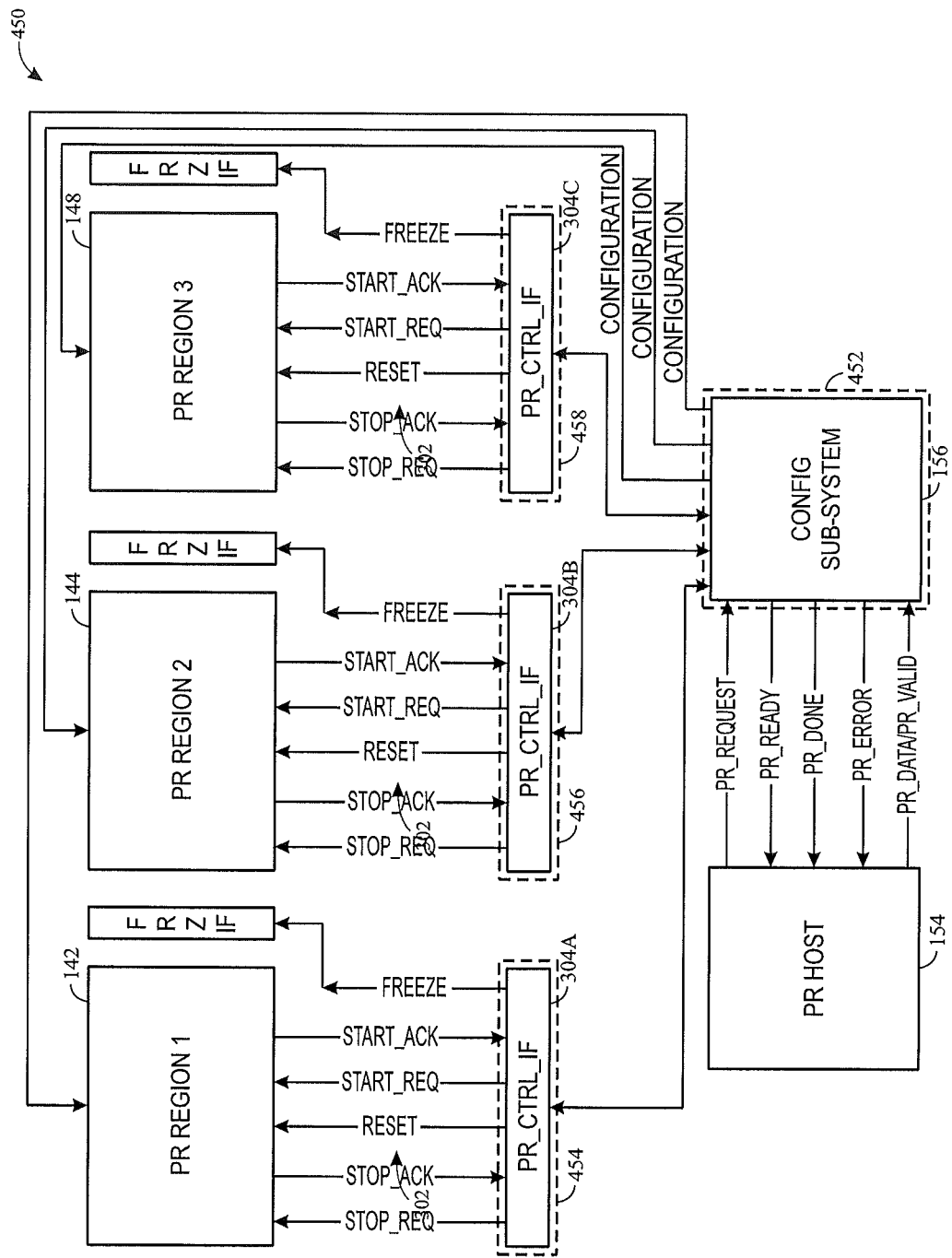
FIG. 10 is a schematic diagram illustrating a configuration system that may implement partial-reconfiguration control interface, in accordance with an embodiment.

Accordingly, FIG. 10 illustrates an embodiment 450 where the configuration system itself has the capability to implement the PR_CTRL_IFs 304A-C. The PR host 154 implementation may be simplified and the only fabric resource that may be used are the connections between the PR host 154 and configuration sub-system 156 and the connections between the PR_CTRL_IFs 304A-C and their associated PR regions 142, 144, and 146. As mentioned above, such a configuration sub-system 156 could be composed of a centralized processor (e.g., a processor 452) that governs and accepts the PR bitstream 27 from the PR host 154 and then issues commands to a collection of distributed processors (e.g., processors 454, 456, and 458) that implement the individual PR_CTRL_Ifs 304A-C. The processors 454, 456, and 458 that implement the PR_CTRL_IFs 304A-C may have I/Os to communicate to the persona in the PR region 144, 146, and/or 148 over the defined interface.

The hardening of the PR_CTRL_Ifs 304A-C reduces the PR host 154 dependency on selecting which persona to change and coordinating the sending of the PR bitstream 27 to the configuration sub-system 156. Furthermore, the PR host 154 consumes fewer resources, the PR_CTRL_Ifs 304A-C do not consume any fabric resources, and changes to the PR_CTRL_Ifs 304A-C are done through PR bitstream 27 changes that control the PR_CTRL_Ifs 304A-C. This avoids having to do recompilations of the static region 158, when changes to the PR_CTRL_IFs 304A-C may be desired. Such recompilations of the static region 158 may or may not require a recompilation of all personas. Because the PR control interface 304A-C is fixed, modification and/or adding new personas that use the I/Os and limited resources of the PR region 144, 146, and/148 that they target can be done without re-configuration of static logic. Instead, only the modified and new personas have to be recompiled. Management activities of the PR host 154 may have to be updated with the changing set of personas and/or constraints of the system. However, this may be done with soft changes that do not use as much processing power or time.

By implementing a partial reconfiguration control interface, a vast array of partial reconfiguration designs (e.g., of PR regions/PR personas) may be developed and deployed, with reduced compilation dependency on an integrated circuit. This may increase partial-reconfiguration operational efficiencies, creating added utility for the ICs.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An integrated circuit (IC), comprising:
   partial reconfiguration circuitry, comprising one or more partial reconfiguration regions with associated personas, the associated personas comprising reconfiguration instructions for particular partial reconfiguration implementations for the associated partial reconfiguration regions;
   a partial reconfiguration control interface, comprising circuitry that, upon a request to swap a current persona of a target region of the one or more partial reconfiguration regions with a new persona, performs a persona-swap, including by:
      stopping the current persona in the target region;
      reconfiguring the target region based upon the new persona;
      resetting the new persona; and
      starting the new persona in the target region, in a manner that does not corrupt memory of the target region.

2. The integrated circuit of claim 1, wherein the partial reconfiguration control interface comprises a centralized processor that implements processor-readable instructions to perform the persona-swap; and
   wherein the centralized processor directs coordination of the persona-swap including by coordinating operations via one or more distributed processors over a network-on-chip.

3. The integrated circuit of claim 1, wherein the partial reconfiguration control interface provides signaling to a static region of the integrated circuit, indicating that the persona-swap is being performed, such that the static region may protect itself by not referencing the target region during performance of the persona-swap; and
   wherein the partial reconfiguration control interface provides interface signals to the static region, when the static region may begin interfacing with the new persona in the target region.

4. The integrated circuit of claim 1, wherein the partial reconfiguration control interface disallows multiple persona-swaps of a common region at a common time; and
   wherein the persona-swap is performed without recompilation of the associated personas and static logic of the integrated circuit.

5. The integrated circuit of claim 1, wherein the partial reconfiguration control interface detects the request to swap the current persona of the target region of the one or more partial reconfiguration regions with the new persona, via a partial reconfiguration bitstream provided to the integrated circuit from a host device.

6. The integrated circuit of claim 1, wherein stopping the current persona in the target region comprises:
   providing a stop request signal to the target region; and
   when the current persona is stopped, receiving a stop acknowledgement, acknowledging that use of the current persona has stopped execution.

7. The integrated circuit of claim 6, wherein the partial reconfiguration control interface triggers timeout of a reception of stop acknowledgment, when a timeout threshold time period is exceeded; and
   wherein when the stop acknowledgment is not driven, a default constant signal is provided.

8. The integrated circuit of claim 1, wherein starting the new persona in the target region comprises:
   providing a start request signal to the target region; and
   when the current persona is started, receiving a start acknowledgement, acknowledging that use of the current persona has stopped execution.

9. The integrated circuit of claim 8, wherein the partial reconfiguration control interface triggers timeout of reception of start acknowledgment, when a timeout threshold time period is exceeded; and
   wherein when the start acknowledgment is not driven, a default constant signal is provided.

10. The integrated circuit of claim 1, comprising:
    a freeze interface that freezes access of the target region by a static region, when a freeze signal is provided by the partial reconfiguration control interface.

11. The integrated circuit of claim 10, wherein the partial reconfiguration control interface provides the freeze signal to the freeze interface after the current persona has stopped execution.

12. A method, comprising:
    receiving a request, via at least one processor of an integrated circuit, to perform a persona-swap from a current persona of a target region of a plurality of partial reconfiguration regions of an integrated circuit to a new persona of the target region;
    stopping, via the at least one processor, the current persona in the target region;
    reconfiguring, via the at least one processor, the target region based upon the new persona;
    resetting, via the at least one processor, the new persona; and
    starting, via the at least one processor, the new persona in the target region, in a manner that does not corrupt memory of the region;
    wherein the current persona and the new persona comprise reconfiguration instructions for the target region.

13. The method of claim 12, comprising:
    asserting, via a partial reconfiguration control interface, a stop request that requests that the current persona stop execution in the target region, upon receiving the request to perform the persona-swap; and
    upon receiving a stop acknowledgement signal indicating that the current persona has stopped execution, asserting, via the partial reconfiguration control interface, a freeze signal that indicates that the target region will be reconfigured and a static region of the integrated circuit should not access the target region.

14. The method of claim 13, comprising:
de-asserting the freeze signal, via the partial reconfiguration control interface, after resetting the new persona, but before starting the new persona;
wherein resetting the new persona comprises asserting a reset signal, via the partial reconfiguration control interface, for at least a long enough period of time to bring the new persona into an expected initial state; and
wherein starting the new persona comprises asserting a start request signal, via the partial reconfiguration control interface.

15. A partial reconfiguration control interface system for an integrated circuit, comprising:
a first partial reconfiguration control interface associated with a first partial reconfiguration region of the integrated circuit;
a second partial reconfiguration control interface associated with a second partial reconfiguration region of the integrated circuit;
wherein the first partial reconfiguration control interface and second partial reconfiguration control interface comprise:
a processor that:
stops a current persona in an associated region;
reconfigures the associated region based upon a new persona;
resets the new persona; and
starts the new persona in the associated region, in a manner that does not corrupt memory of the associated region.

16. The partial reconfiguration control interface system of claim 15, wherein:
the first partial reconfiguration control interface and second partial reconfiguration control interface comprise a common processor.

17. The partial reconfiguration control interface system of claim 15, wherein:
the first partial reconfiguration control interface and second partial reconfiguration control interface comprise separate processors.

18. The partial reconfiguration control interface system of claim 15, wherein:
the first partial reconfiguration control interface, the second partial reconfiguration control interface, or both:
stop the current persona in the associated region by providing one or more signals to the associated region;
reconfigure the associated region based upon the new persona by providing a second one or more signals to the associated region;
reset the new persona by providing a third one or more signals to the associated region; and
start the new persona in the associated region, by providing a forth one or more signals to the associated region.

19. The partial reconfiguration control interface system of claim 15, wherein:
the first partial reconfiguration control interface, the second partial reconfiguration control interface, or both:
stop the current persona in the associated region by providing one or more signals to a first one or more static regions of the integrated circuit;
reconfigure the associated region based upon the new persona by providing a second one or more signals to a second one or more static regions of the integrated circuit;
reset the new persona by providing a third one or more signals to a third one or more static regions of the integrated circuit; and
start the new persona in the associated region, by providing a forth one or more signals to a fourth one or more static regions of the integrated circuit.

20. The partial reconfiguration control interface system of claim 15, wherein:
the first partial reconfiguration control interface, the second partial reconfiguration control interface, or both:
stop the current persona in the associated region;
reconfigure the associated region based upon the new persona;
reset the new persona; and
start the new persona in the associated region, including by sending a first set of signals to the associated region and a second set of signals to one or more static regions of the integrated circuit.

* * * * *